United States Patent
Meusburger et al.

(10) Patent No.: US 11,356,095 B2
(45) Date of Patent: Jun. 7, 2022

(54) HIGH VOLTAGE SHIFTERS

(71) Applicant: Dialog Semiconductor (UK) Limited, London (GB)

(72) Inventors: Walter Meusburger, Graz (AT); Thomas Jackum, Feldkirchen bei Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 17/224,215

(22) Filed: Apr. 7, 2021

(65) Prior Publication Data

US 2022/0149842 A1    May 12, 2022

(30) Foreign Application Priority Data

Nov. 11, 2020   (DE) .......................... 102020214195.9

(51) Int. Cl.
| | |
|---|---|
| *H03K 19/0175* | (2006.01) |
| *H03K 19/0185* | (2006.01) |
| *H03K 3/356* | (2006.01) |
| *H03L 5/00* | (2006.01) |
| *H03K 17/081* | (2006.01) |

(52) U.S. Cl.
CPC ............... *H03K 19/018521* (2013.01); *H03K 3/356113* (2013.01); *H03K 17/08104* (2013.01)

(58) Field of Classification Search
None
See application file for complete search history.

(56) References Cited

U.S. PATENT DOCUMENTS

| | | | | |
|---|---|---|---|---|
| 5,923,211 A | * | 7/1999 | Maley | ........................ G05F 1/46 327/540 |
| 5,969,542 A | * | 10/1999 | Maley | .................... H03K 3/012 326/17 |

(Continued)

FOREIGN PATENT DOCUMENTS

| | | |
|---|---|---|
| DE | 10 2007 050 049 A1 | 4/2009 |
| DE | 10 2008 056 131 A1 | 5/2010 |

OTHER PUBLICATIONS

German Office Action, File No. 10 2020 214 195.9, Applicant: Dialog Semiconductor (UK) Limited, dated Jul. 6, 2021, 8 pages.

(Continued)

*Primary Examiner* — Kenneth B Wells
(74) *Attorney, Agent, or Firm* — Saile Ackerman LLC; Stephen B. Ackerman

(57) ABSTRACT

The present document relates to a level shifter circuit configured to transform an input voltage at an input of the level shifter circuit into an output voltage at an output of the level shifter circuit. The level shifter circuit may comprise a first switching element coupled between an output supply voltage and a positive output terminal, wherein a control terminal of the first switching element is coupled to a negative output terminal. The level shifter circuit may comprise a second switching element coupled between the output supply voltage and the negative output terminal, wherein a control terminal of the second switching element is coupled to the positive output terminal. The level shifter circuit may comprise a drive circuit configured to drive the control terminals of the first and the second switching element based on the input voltage at the input of the level shifter circuit.

30 Claims, 9 Drawing Sheets

(56) References Cited

U.S. PATENT DOCUMENTS

| | | | | |
|---|---|---|---|---|
| 5,995,010 | A * | 11/1999 | Blake | H03K 3/356113 |
| | | | | 324/73.1 |
| 6,614,283 | B1 * | 9/2003 | Wright | H03K 3/356113 |
| | | | | 326/68 |
| 6,700,407 | B1 * | 3/2004 | Wert | H03K 3/356113 |
| | | | | 326/62 |
| 7,215,146 | B2 * | 5/2007 | Khan | H03K 3/356113 |
| | | | | 326/68 |
| 7,368,969 | B2 * | 5/2008 | Suzuki | H02M 3/07 |
| | | | | 327/333 |
| 2010/0109743 | A1 | 5/2010 | Czech et al. | |

OTHER PUBLICATIONS

"A Low Power High Speed Level Shifter Design for up to 40V" by Stephan Dobretsberger et al., Dialog Semiconductor, {stephan.dobretsberger, bernhard.mayr} @diasemi.com, Austrochip 2010, pp. 7-10.

"Fast and Robust Level Shifters in 65 nm CMOS," by Gerhard Maderbacher et al., 2011 IEEE, 2011 Proceedings of the ESSCIRC, Sep. 12-16, 2011, pp. 195-198.

* cited by examiner

HIGH VOLTAGE SHIFTERS

TECHNICAL FIELD

The present document relates to high voltage level shifters. In particular, the present document relates to high voltage level shifters which are robust, exhibit low power consumption and may be operated at different supply voltages.

BACKGROUND

Level shifters are typically used as building blocks in DC (Direct Current)/DC power converters. In particular, level shifters are required to interface sub-circuits operating in different voltage domains. For example, level shifters may connect a controller in a low voltage supply domain with a power switch in a high voltage supply domain.

A first class of level shifters known from the prior art concerns static level shifters without static current consumption. However, the latter level shifters might not work at low supply voltages and/or might be slow. Moreover, a change of the input supply domain versus the output supply domain might generate a false output pulse. A second class of level shifters known from the prior art concerns static level shifters with static current consumption. This class of level shifters suffers from high power dissipation and low system efficiency. A third class of level shifters concerns edge sensitive level shifters. However, this class of level shifters is prone to errors due to missing an input edge. In existing designs, this might even cause a dead lock of the whole system, and the cause for this dead lock may be very difficult to find in simulations.

In summary, a disadvantage of the current practice of edge sensitive level shifters is that a signal change might be missed. A further disadvantage of the current practice of level sensitive level shifters is a static current consumption. Yet another disadvantage of the current practice is the limitation of the lowest possible supply voltage.

SUMMARY

The present document addresses the above-mentioned technical problems. In particular, the present document addresses the technical problem of providing a novel level shifter circuit which may be operated at different supply voltages.

According to an aspect, a level shifter circuit is presented. The level shifter circuit may be configured to transform an input voltage at an input of the level shifter circuit into an output voltage at an output of the level shifter circuit. The level shifter circuit may comprise a first switching element coupled between an output supply voltage and a positive output terminal, wherein a control terminal of the first switching element is coupled to a negative output terminal. The level shifter circuit may comprise a second switching element coupled between the output supply voltage and the negative output terminal, wherein a control terminal of the second switching element is coupled to the positive output terminal. The level shifter circuit may comprise a drive circuit configured to drive the control terminals of the first and the second switching element based on the input voltage at the input of the level shifter circuit. The level shifter circuit may comprise a first protection transistor coupled between the positive output terminal and an input reference voltage. The level shifter circuit may comprise a second protection transistor coupled between the negative output terminal and the input reference voltage. The level shifter circuit may be configured to adaptively control the first and the second protection transistor based on the output supply voltage and/or an output reference voltage.

The first and the second switching elements may be implemented with any suitable devices, such as, for example, metal-oxide-semiconductor field effect transistors (MOSFETs), insulated-gate bipolar transistors (IGBTs), or MOS-gated thyristors. The control terminal of a switching element may be a gate to which a respective driving voltage or control signal may be applied to turn the switching element on (i.e. to close the switching element) or to turn the switching element off (i.e. to open the switching element).

Similarly, the first and the second protection transistors may be implemented with any suitable devices, such as, for example, MOSFETs, IGBTs, MOS-gated thyristors, or any other suitable power devices. Specifically, the first and the second protection transistors may be high-voltage (HV) extended-drain MOS (EDMOS) field-effect transistors (FETs). Moreover, the first and the second protection transistors may be operated in a linear mode of operation (also known as current saturation region), wherein the drain-source current of the respective protection transistor is almost independent of the drain-source voltage, and directly depends on the gate-source voltage.

The input voltage may represent a binary input signal which may either have a logical high value or a logical low value. In particular, the input voltage may either have a signal value corresponding to an input supply voltage or a signal value corresponding to the input reference voltage. Likewise, the output voltage may represent a binary output signal which may either have a logical high value or a logical low value. The output voltage may either have a signal value corresponding to the output supply voltage or a signal value corresponding to the output reference voltage.

The described level shifter circuit may be e.g. a level up shifter circuit. In other words, the output supply voltage may be greater than or equal to the input supply voltage, and/or the output reference voltage may be greater than or equal to the input reference voltage. For example, the input reference voltage and/or the output reference voltage may be ground, i.e. 0V. However, the reference voltages are not limited to ground. In particular, the reference voltages may not have a direct physical connection to earth. Rather, the term reference voltage may also refer to any reference point to which and from which electrical currents may flow, or from which voltages may be measured. The input reference voltage may be different from the output reference voltage.

The output voltage of the level shifter circuit may be derived from the positive output terminal or from the negative output terminal. For example, the level shifter circuit may be configured to generate the output voltage from the negative output terminal. To this end, the level shifter circuit may comprise an inverter circuit coupled between the negative output terminal and the output of the level shifter circuit such that the output voltage represents an inverted version of the voltage at the negative output terminal. By coupling an inverter circuit between the negative output terminal and the output of the level shifter circuit, it becomes possible to make the transition edge cleaner and to decouple the negative output terminal from any unknown load.

The level shifter circuit may be configured to generate a control voltage dependent on the output supply voltage and/or the output reference voltage, and the level shifter circuit may be configured to apply the control voltage to control terminals of the first and the second protection transistors.

The level shifter circuit may be configured to generate the control voltage such that the control voltage is greater than or equal to a first threshold voltage, wherein the first threshold voltage is equal to the output reference voltage minus a threshold voltage of the first or the second protection transistor.

By generating a control voltage greater than or equal to the first threshold voltage, it becomes possible to guarantee correct operation of the level shifter circuit at low output supply voltages.

In order to generate the control voltage which is greater than or equal to the first threshold voltage, the level shifter circuit may comprise an auxiliary reference potential generator (such as e.g. a charge pump) for generating an auxiliary reference potential below the output reference voltage. The level shifter circuit may further comprise a diode-connected transistor and a current source coupled in series between said auxiliary reference potential and the output reference voltage for generating the control voltage which may be subsequently applied to the control terminals of the first and the second protection transistor. The first threshold voltage, which may serve as initial control voltage, may be derived e.g. from the source or the drain of said diode-connected transistor. For example, the threshold voltage of the diode-connected transistor may be equal to or similar to the threshold voltage of the first or the second protection transistor.

Further, the level shifter circuit may comprise a resistive element coupled in series with the diode-connected transistor and the current source for adjusting the control voltage.

The level shifter circuit may be configured to generate the control voltage such that the control voltage is greater than or equal to a second threshold voltage, wherein the second threshold voltage is equal to the output supply voltage minus a maximum gate-source voltage of the first or the second protection transistor.

By generating the control voltage greater than or equal to the second threshold voltage, the protection transistors are prevented from damage due to high gate-source voltages. The level shifter circuit may be configured to generate the control voltage such that the control voltage is both (a) greater than or equal to the first threshold voltage and (b) greater than or equal to the second threshold voltage. This enables correct operation of the level shifter circuit at low output supply voltages and, at the same time, save operation of the protection transistors for all output supply voltages.

In order to generate the control voltage which is greater than or equal to the second threshold voltage, the level shifter circuit may comprise a second reference potential generator for generating the second threshold voltage. Second reference potential generator may comprise e.g. reference voltage source which is coupled to the output supply voltage, wherein said reference voltage source is configured to generate a voltage corresponding to the maximum gate-source voltage of the first or the second protection transistor. The level shifter circuit may further comprise a comparator circuit configured to compare the second threshold voltage generated by the second reference potential generator with the initial control voltage. The level shifter circuit may further comprise a transistor for enforcing the second threshold voltage, wherein said transistor is coupled between the output supply voltage and the output reference voltage, and wherein said transistor is controlled by said comparator.

The level shifter circuit may be configured to generate the control voltage such that the control voltage is smaller than or equal to the output reference voltage.

The level shifter circuit may be configured to generate the control voltage such that the control voltage is (a) greater than or equal to the first threshold voltage, (b) greater than or equal to the second threshold voltage, and (c) smaller than or equal to the output reference voltage.

In order to generate the control voltage which is smaller than or equal to the output reference voltage, the level shifter circuit may comprise a further comparator configured to compare the control voltage with the output reference voltage. Again, the level shifter circuit may comprise a further transistor for limiting the control voltage to the output reference voltage, wherein said further transistor is coupled between the output supply voltage and the output reference voltage, and wherein said further transistor is controlled by said further comparator.

The drive circuit may comprise a first drive transistor coupled between the positive output terminal and the input reference voltage, wherein a control terminal of the first drive transistor is coupled to the input of the level shifter circuit. The drive circuit may comprise a second drive transistor coupled between the negative output terminal and the input reference voltage, wherein a control terminal of the second drive transistor is coupled to the input of the level shifter circuit.

In other words, the drive circuit may be coupled between the input of the level shifter circuit and the low reference voltage. As such, the drive circuit may be said to be arranged in the input supply domain and may be configured to drive the first and the second switching element which may be said to be arranged in the output supply domain (i.e. they are coupled between the output supply voltage and the output reference voltage). The drive circuit may further comprise an inverter circuit coupled between the control terminals of the first and the second drive transistor such that a drive signal of the second drive transistor is an inverter version of a drive signal of the first drive transistor. In addition, the drive circuit may comprise a further inverter circuit coupled between the input of the level shifter circuit and the control terminal of the first drive transistor.

The level shifter circuit may further comprise a first directional conducting element coupled between the positive output terminal and the input reference voltage. The level shifter circuit may further comprise a second directional conducting element coupled between the negative output terminal and the input reference voltage.

Both the first and the second directional conducting elements may be diodes e.g. bipolar diodes. As an example, a diode-connected transistor may serve as diode. In general, a directional conducting element is considered as an electronic component with at least two terminals that conducts primarily in one direction. That is, the directional conducting element has low resistance to the flow of current in a first direction, and high resistance in a second, opposite direction. An ideal diode would exhibit zero resistance in the first direction and infinite resistance in the second direction. For instance, the first directional conducting element may have a low resistance from the positive output terminal to the input reference voltage to avoid reverse current in scenarios when the input reference voltage is larger than the output reference voltage. Analogously, the second directional conducting element may have a low resistance from the negative output terminal to the input reference voltage.

For example, the first directional conducting element may be coupled between the first protection transistor and the first drive transistor of the drive circuit, and the second directional conducting element may be coupled between the second protection transistor and the second drive transistor of the drive circuit.

The level shifter circuit may further comprise a third switching element coupled between the positive output terminal and the output reference voltage, wherein a control terminal of the third switching element is coupled to the negative output terminal. The level shifter circuit may further comprise a fourth switching element coupled between the negative output terminal and the output reference voltage, wherein a control terminal of the fourth switching element is coupled to the positive output terminal.

The third and the fourth switching element may be implemented using similar or identical circuit elements as described above in the context of the first and the second switching element. With the help of the third switching element and the fourth switching element, it becomes possible to establish a well-defined low value of the output voltage.

The level shifter circuit may further comprise a first auxiliary switching element, a second auxiliary switching element, a first delay element, and a first inverter. The first auxiliary switching element and the second auxiliary switching element may be coupled in series between the output supply voltage and the positive output terminal. The negative output terminal may be coupled to a control terminal of the first auxiliary switching element. The negative output terminal may be coupled via the first delay element and via the first inverter to a control terminal of the second auxiliary switching element.

The first and second auxiliary switching element may be implemented using components similar or identical to the above-described switching elements. For example, an on-resistance of the drain-source channel of the first and second auxiliary switching element may be lower than an on-resistance of the drain-source channel of the first switching element. With the first and second auxiliary switching element, it becomes possible to accelerate the switching behavior of the level shifter circuit.

The level shifter circuit may further comprise a third auxiliary switching element, a fourth auxiliary switching element, a second delay element, and a second inverter. The third auxiliary switching element and the fourth auxiliary switching element may be coupled in series between the output supply voltage and the negative output terminal. The positive output terminal may be coupled to a control terminal of the third auxiliary switching element. The positive output terminal may be coupled via the second delay element and via the second inverter to a control terminal of the fourth auxiliary switching element.

The third and fourth auxiliary switching element may be implemented using components similar or identical to the above-described switching elements. For example, an on-resistance of the drain-source channel of the third and fourth auxiliary switching element may be lower than an on-resistance of the drain-source channel of the second switching element. With the third and fourth auxiliary switching element, it becomes possible to accelerate the switching behavior of the level shifter circuit.

The level shifter circuit may further comprise a fifth auxiliary switching element, a sixth auxiliary switching element, a third delay element, and a third inverter. The fifth auxiliary switching element and the sixth auxiliary switching element may be coupled in series between the output reference voltage and the positive output terminal. The negative output terminal may be coupled to a control terminal of the fifth auxiliary switching element. The negative output terminal may be coupled via the third delay element and via the third inverter to a control terminal of the sixth auxiliary switching element.

The level shifter circuit may further comprise a seventh auxiliary switching element, a eighth auxiliary switching element, a fourth delay element, and a fourth inverter. The seventh auxiliary switching element and the eighth auxiliary switching element may be coupled in series between the output reference voltage and the negative output terminal. The positive output terminal may be coupled to a control terminal of the seventh auxiliary switching element. The positive output terminal may be coupled via the fourth delay element and via the fourth inverter to a control terminal of the eighth auxiliary switching element.

According to another aspect, a level shifter circuit may be configured to transform an input voltage at an input of the level shifter circuit into an output voltage at an output of the level shifter circuit. The level shifter circuit may comprise a first switching element coupled between an output reference voltage and a positive output terminal, wherein a control terminal of the first switching element is coupled to a negative output terminal. The level shifter circuit may comprise a second switching element coupled between the output reference voltage and the negative output terminal, wherein a control terminal of the second switching element is coupled to the positive output terminal. The level shifter circuit may comprise a drive circuit configured to drive the control terminals of the first and the second switching element based on the input voltage at the input of the level shifter circuit. The level shifter circuit may comprise a first protection transistor coupled between the positive output terminal and an input supply voltage. The level shifter circuit may comprise a second protection transistor coupled between the negative output terminal and the input supply voltage. The level shifter circuit may be configured to adaptively control the first and the second protection transistor based on an output supply voltage and/or the output reference voltage.

The described level shifter circuit may be e.g. a level down shifter circuit. In other words, the output supply voltage may be smaller than or equal to the input supply voltage, and/or the output reference voltage may be smaller than or equal to the input reference voltage.

The level shifter circuit may be configured to generate a control voltage dependent on the output supply voltage and/or the output reference voltage, and the level shifter circuit may be configured to apply the control voltage to control terminals of the first and the second protection transistors.

The level shifter circuit may be configured to generate the control voltage such that the control voltage is smaller than or equal to a first threshold voltage, wherein the first threshold voltage is equal to the output supply voltage plus a threshold voltage of the first or the second protection transistor.

The level shifter circuit may be configured to generate the control voltage such that the control voltage is smaller than or equal to a second threshold voltage, wherein the second threshold voltage is equal to the output reference voltage plus a maximum gate-source voltage of the first or the second protection transistor. Alternatively, or additionally, the level shifter circuit may be configured to generate the control voltage such that the control voltage is larger than or equal to the output supply voltage.

The drive circuit may comprise a first drive transistor coupled between the positive output terminal and an input supply voltage, wherein a control terminal of the first drive transistor is coupled to the input of the level shifter circuit. The drive circuit may comprise a second drive transistor coupled between the negative output terminal and the input supply voltage, wherein a control terminal of the second drive transistor is coupled to the input of the level shifter circuit.

The level shifter circuit may further comprise a first directional conducting element coupled between the positive output terminal and the input supply voltage. The level shifter circuit may further comprise a second directional conducting element coupled between the negative output terminal and the input supply voltage.

The level shifter circuit may further comprise a third switching element coupled between the positive output terminal and the output supply voltage, wherein a control terminal of the third switching element is coupled to the negative output terminal. The level shifter circuit may further comprise a fourth switching element coupled between the negative output terminal and the output supply voltage, wherein a control terminal of the fourth switching element is coupled to the positive output terminal.

The level shifter circuit may further comprise a first auxiliary switching element, a second auxiliary switching element, a first delay element, and a first inverter. The first auxiliary switching element and the second auxiliary switching element may be coupled in series between the output reference voltage and the positive output terminal. The negative output terminal may be coupled to a control terminal of the first auxiliary switching element. The negative output terminal may be coupled via the first delay element and via the first inverter to a control terminal of the second auxiliary switching element.

The level shifter circuit may further comprise a third auxiliary switching element, a fourth auxiliary switching element, a second delay element, and a second inverter. The third auxiliary switching element and the fourth auxiliary switching element may be coupled in series between the output reference voltage and the negative output terminal. The positive output terminal may be coupled to a control terminal of the third auxiliary switching element. The positive output terminal may be coupled via the second delay element and via the second inverter to a control terminal of the fourth auxiliary switching element.

The level shifter circuit may further comprise a fifth auxiliary switching element, a sixth auxiliary switching element, a third delay element, and a third inverter. The fifth auxiliary switching element and the sixth auxiliary switching element may be coupled in series between the output reference voltage and the positive output terminal. The negative output terminal may be coupled to a control terminal of the fifth auxiliary switching element. The negative output terminal may be coupled via the third delay element and via the third inverter to a control terminal of the sixth auxiliary switching element.

The level shifter circuit may further comprise a seventh auxiliary switching element, a eighth auxiliary switching element, a fourth delay element, and a fourth inverter. The seventh auxiliary switching element and the eighth auxiliary switching element may be coupled in series between the output reference voltage and the negative output terminal. The positive output terminal may be coupled to a control terminal of the seventh auxiliary switching element. The positive output terminal may be coupled via the fourth delay element and via the fourth inverter to a control terminal of the eighth auxiliary switching element.

According to another aspect, a method of transforming an input voltage is described. The method may comprise steps which correspond to the features of the level shifter circuit described in the present document. More specifically, the present document discloses a method of transforming, using a level shifter circuit, an input voltage at an input of the level shifter circuit into an output voltage at an output of the level shifter circuit. The method may comprise coupling a first switching element between an output supply voltage and a positive output terminal, and coupling a control terminal of the first switching element to a negative output terminal. The method may comprise coupling a second switching element between the output supply voltage and the negative output terminal, and coupling a control terminal of the second switching element to the positive output terminal. The method may comprise driving, using a drive circuit, the control terminals of the first and the second switching element based on the input voltage at the input of the level shifter circuit. The method may comprise coupling a first protection transistor between the positive output terminal and an input reference voltage. The method may comprise coupling a second protection transistor between the negative output terminal and the input reference voltage. The method may comprise adaptively controlling the first and the second protection transistor based on the output supply voltage and/or an output reference voltage.

The method may further comprise generating a control voltage dependent on the output supply voltage and/or the output reference voltage, and applying the control voltage to control terminals of the first and the second protection transistors.

The method may comprise generating the control voltage such that the control voltage is greater than or equal to a first threshold voltage, wherein the first threshold voltage is equal to the output reference voltage minus a threshold voltage of the first or the second protection transistor. Alternatively or additionally, the method may comprise generating the control voltage such that the control voltage is greater than or equal to a second threshold voltage, wherein the second threshold voltage is equal to the output supply voltage minus a maximum gate-source voltage of the first or the second protection transistor. The method may comprise generating the control voltage such that the control voltage is smaller than or equal to the output reference voltage.

The method may comprise coupling a first drive transistor of the drive circuit between the positive output terminal and the input reference voltage, and coupling a control terminal of the first drive transistor to the input of the level shifter circuit. The method may comprise coupling a second drive transistor of the drive circuit between the negative output terminal and the input reference voltage, and coupling a control terminal of the second drive transistor to the input of the level shifter circuit.

The method may comprise coupling a first directional conducting element between the positive output terminal and the input reference voltage. Similarly, the method may comprise coupling a second directional conducting element between the negative output terminal and the input reference voltage.

According to yet another aspect, another method of transforming an input voltage is described. Again, the method uses a level shifter circuit for transforming an input voltage at an input of the level shifter circuit into an output voltage at an output of the level shifter circuit. The method may comprise coupling a first switching element between an output reference voltage and a positive output terminal, and coupling a control terminal of the first switching element to a negative output terminal. The method may comprise coupling a second switching element between the output reference voltage and the negative output terminal, and coupling a control terminal of the second switching element to the positive output terminal. The method may comprise driving, using a drive circuit, to drive the control terminals of the first and the second switching element based on the input voltage at the input of the level shifter circuit. The method may comprise coupling a first protection transistor between the positive output terminal and an input supply voltage. The method may comprise coupling a second protection transistor coupled between the negative output terminal and the input supply voltage. The method may comprise adaptively controlling the first and the second protection transistor based on an output supply voltage and/or the output reference voltage.

The method may further comprise generating a control voltage dependent on the output supply voltage and/or the output reference voltage. The method may further comprise applying the control voltage to control terminals of the first and the second protection transistors. The method may further comprise generating the control voltage such that the control voltage is smaller than or equal to a first threshold voltage, wherein the first threshold voltage is equal to the output supply voltage plus a threshold voltage of the first or the second protection transistor. The method may further comprise generating the control voltage such that the control voltage is smaller than or equal to a second threshold voltage, wherein the second threshold voltage is equal to the output reference voltage plus a maximum gate-source voltage of the first or the second protection transistor. The method may further comprise generating the control voltage such that the control voltage is larger than or equal to the output supply voltage.

The method may further comprise coupling a first drive transistor between the positive output terminal and an input supply voltage, wherein a control terminal of the first drive transistor is coupled to the input of the level shifter circuit. The method may further comprise coupling a second drive transistor between the negative output terminal and the input supply voltage, wherein a control terminal of the second drive transistor is coupled to the input of the level shifter circuit.

The method may further comprise coupling a first directional conducting element between the positive output terminal and the input supply voltage. The method may further comprise coupling a second directional conducting element between the negative output terminal and the input supply voltage.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DETAILED DESCRIPTION

A main challenge is to operate a level shifter at very low supply voltages where the threshold voltage of the high voltage transistors starts to be a limiting factor. With this limit in mind, the level shifters shall be fast and robust (i.e. not solely edge sensitive, which could result in memorizing a wrong voltage level), have no static current consumption and work in an environment where the domain voltages may change rapidly.

Figure 1:
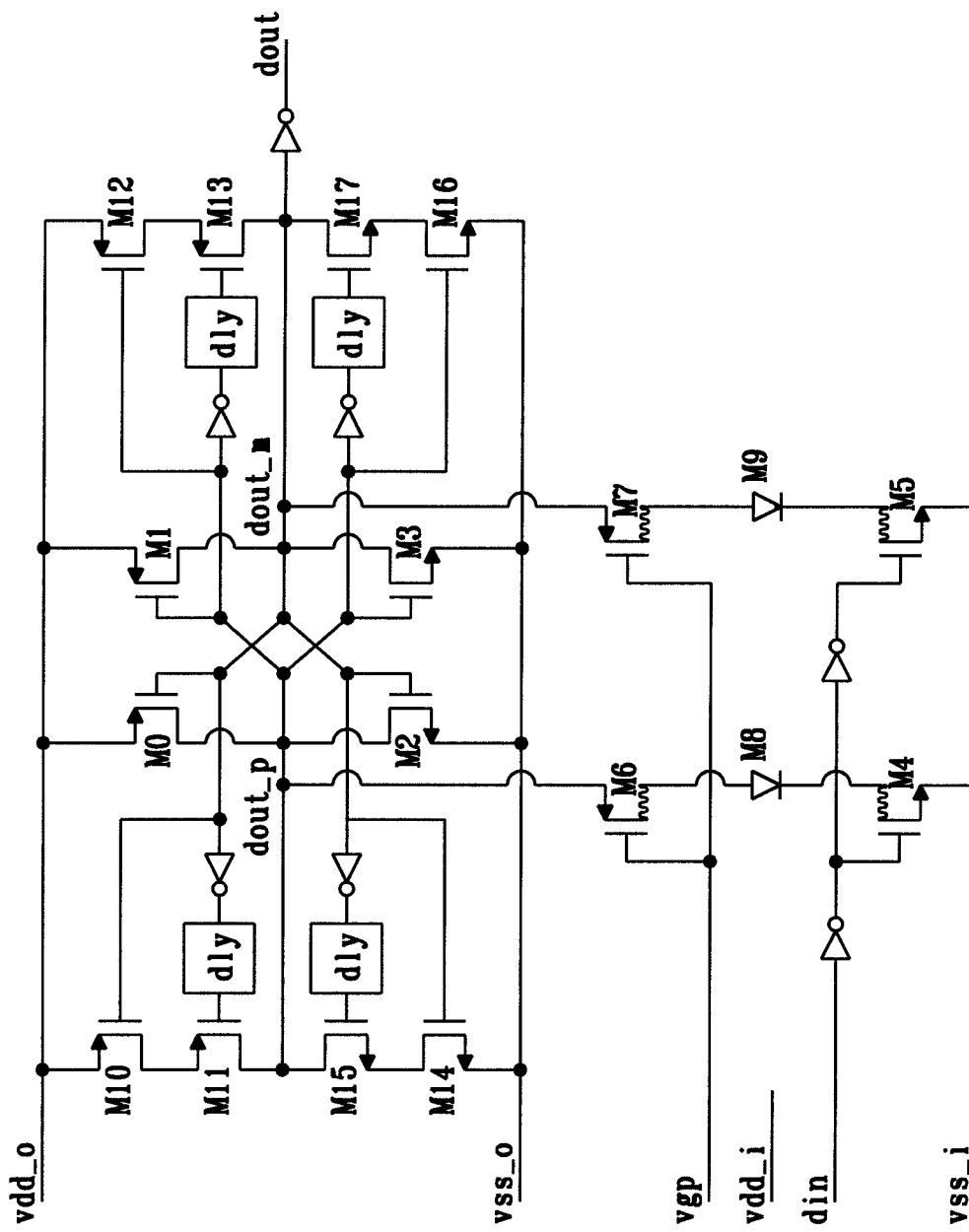
FIG. 1 shows an exemplary embodiment of a level up shifter circuit.

FIG. 1 shows an exemplary embodiment of a level up shifter circuit. The level shifter circuit transforms an input voltage din at an input of the level shifter circuit into an output voltage dout at an output of the level shifter circuit. The level shifter circuit has a first switching element M0 coupled between an output supply voltage vdd_o and a positive output terminal dout_p, wherein a gate of the first switching element M0 is coupled to a negative output terminal dout_m. The level shifter circuit has a second switching element M1 coupled between the output supply voltage vdd_o and the negative output terminal dout_m, wherein a gate of the second switching element is coupled to the positive output terminal dout_p. The level shifter circuit comprises a drive circuit comprising drive transistors M4 and M5 which drive the control terminals of the first and the second switching element based on the input voltage at the input of the level shifter circuit. The level shifter circuit comprises a first protection transistor M6 coupled between the positive output terminal and an input reference voltage. The level shifter circuit comprises a second protection transistor M7 coupled between the negative output terminal and the input reference voltage. The level shifter circuit adaptively controls the first and the second protection transistor M6 and M7 using control voltage vgp based on the output supply voltage vdd_o and/or an output reference voltage vss_o. In FIG. 1, vdd_i denotes the input supply voltage, and vss_i denotes the input reference voltage.

Transistors M0/M1 and M4/M5 form a basic level shifter. Transistors M4/M5 and M6/M7 are high voltage transistors for high voltage protection. Transistors M2/M3 ensure a well-defined low value for dout_p/dout_m based on the output reference voltage ("push-pull" drive). Transistors M0/M1/M2/M3 form a latch, i.e. a memory element for storing a temporary state indicative of the output voltage dout. Transistors M10 to M17 are for speeding up the switching behavior of the level shifter circuit. At this, transistors M10 to M17 overdrive the latch output in transitional states. Diodes M8/M9 avoid reverse current in case of vss_i>vss_o. The latter diodes are located between the drive transistors and the latch and avoid that the latch is clamped in the case of vss_i>vss_o. The gates of protection transistors M6/M7 are driven by the control voltage vgp.

Figure 2:
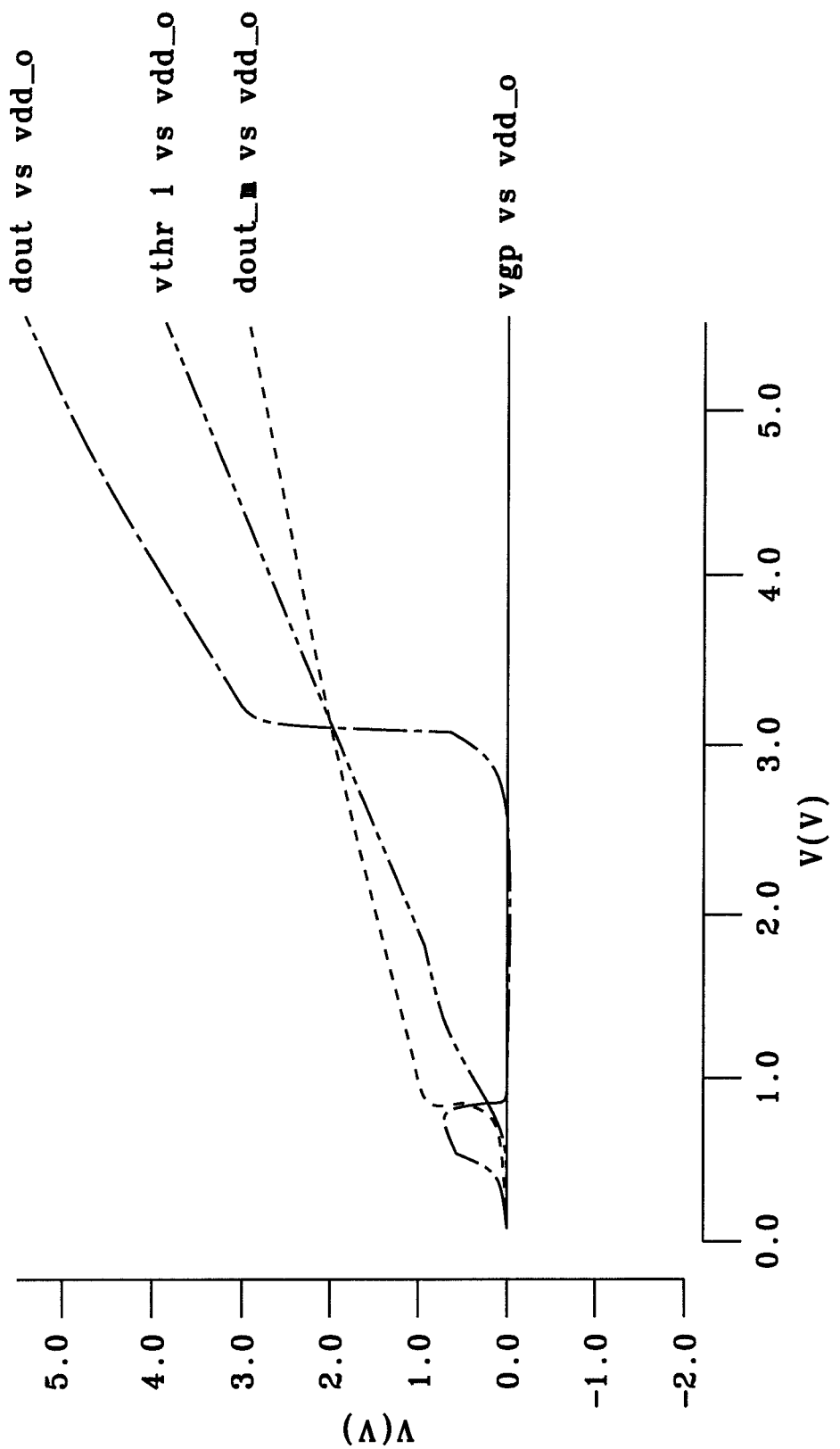
FIG. 2 shows exemplary voltage diagrams for a static control voltage.

FIG. 2 shows exemplary voltage diagrams for a static control voltage vgp which is set to the reference output voltage vss_o. The x-axis shows the output supply voltage vdd_o which is continuously increased during simulation. The input voltage din is set to its logical high value 1 i.e. din is set to input supply voltage vdd_i. When the input voltage din changes from 0 to 1 (or 1 to 0), the transistor M5 (or M4) turns on and pulls down dout_m (or dout_p) below the threshold of transistors M0/M2 (or M1/M3), i.e. vthr1. FIG. 2 shows that this works only above an output supply voltage of about 3.1V in the case that the HV PMOS (M6/M7) gate vgp is set to vss_o. This is a process limitation, and it is even made worse due to the fact that the bulks of transistors M6 and M7 may be connected to vdd_o to avoid charge injections at fast domain voltage changes. The bulk of a transistor may sometimes also be denoted as back-gate, substrate, body, or back-body of a transistor.

Figure 3:
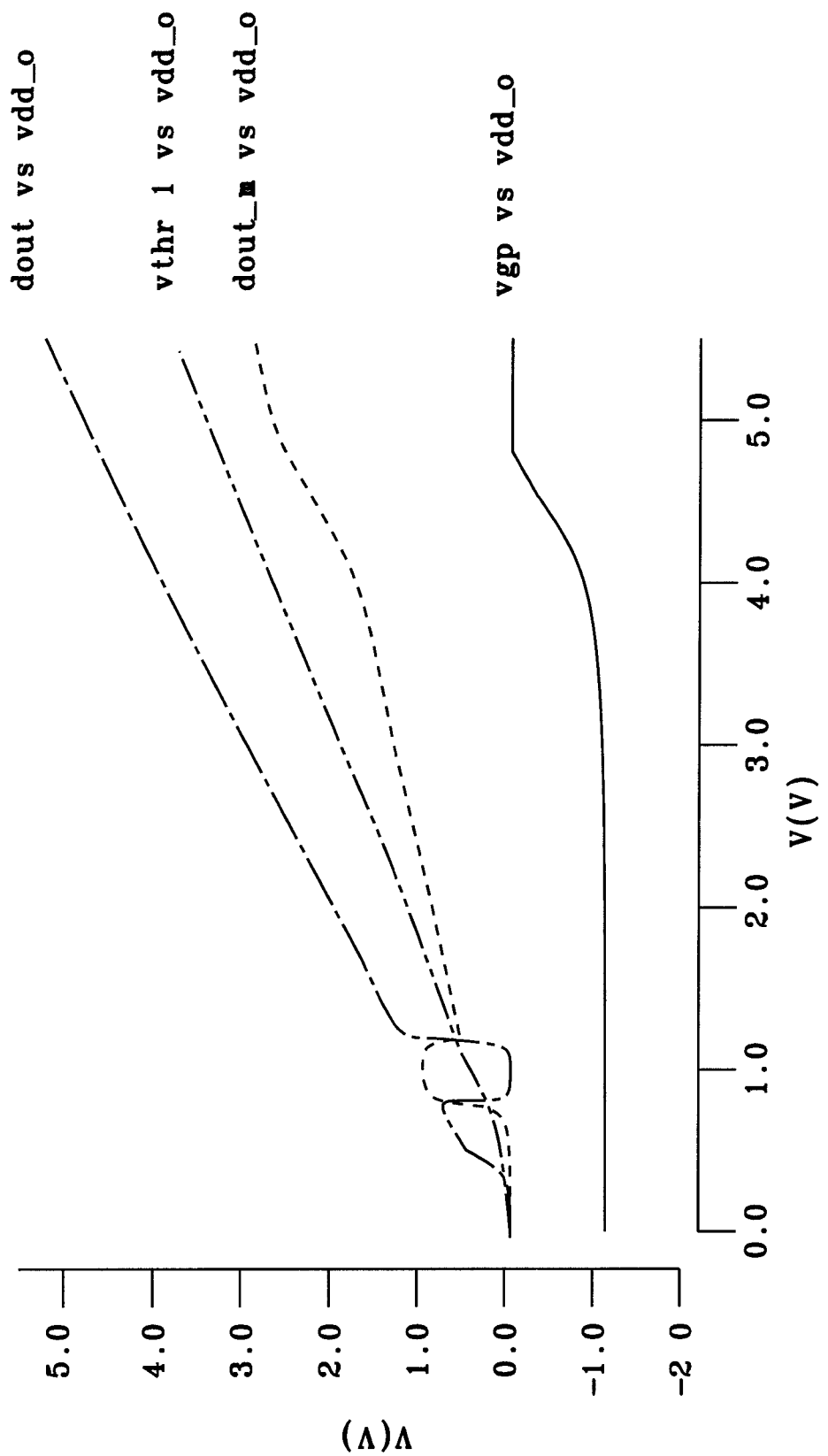
FIG. 3 shows exemplary voltage diagrams for a control voltage which is dynamically adapted.

FIG. 3 shows an improved solution with an auxiliary HV PMOS gate supply vgp (i.e. the control voltage) that is adaptively derived from the output supply level. In other words, FIG. 3 shows exemplary voltage diagrams for a control voltage vgp which is dynamically adapted. This solution allows the minimum supply level to be far lower than 2V. The adaptive derivation of vgp may fulfill the following requirements:

the control voltage vgp must be greater than or equal to vss_o−vth_pmos (i.e. one threshold voltage below vss_o), and the control voltage vgp must be greater than or equal to vdd_o−vgs_max (i.e. vdd_o−vgp must not exceed the save operation area (SOA) limit), whichever is the larger one. This ensures enough headroom for the HV PMOS (M6/M7) at low supply voltages and being safe with SOA for the HV PMOS (M6/M7) at high supply voltages (where the headroom is not needed anymore). Note that to simplify the design, vgs_max can be somewhat lower than the SOA limit as long as there is still enough headroom, but in this case it must be ensured that vgp does not rise above vss_o, so additionally vgp must fulfill the following:

the control voltage vgp must be less than or equal to vss_o.

The resulting constraint for the control voltage vgp can be written as:

$$\min(\max((vss\_o-vth\_pmos),(vdd\_o-vgs\_\max)),vss\_o) \leq vgp \leq vss\_o$$

The proposed solution is level sensitive (i.e. not solely edge sensitive), has no static current consumption, is suitable for level shifting to/from rapidly changing voltage domains (~10V in ~0.1 ns), is operational down to low supply voltages (~2V in a pure 5V BCD process, wherein BCD denotes bipolar-CMOS-DMOS, i.e. bipolar—Complementary Metal Oxide Semiconductor—Double Diffused Metal Oxide Semiconductor), is operational even where the domains are at the same voltage level, offers protection for the case that the input supply is lower than the output supply, is fast (~1 ns delay), and has a low dynamic current consumption (~10 pC per falling+rising data input).

Figure 4:
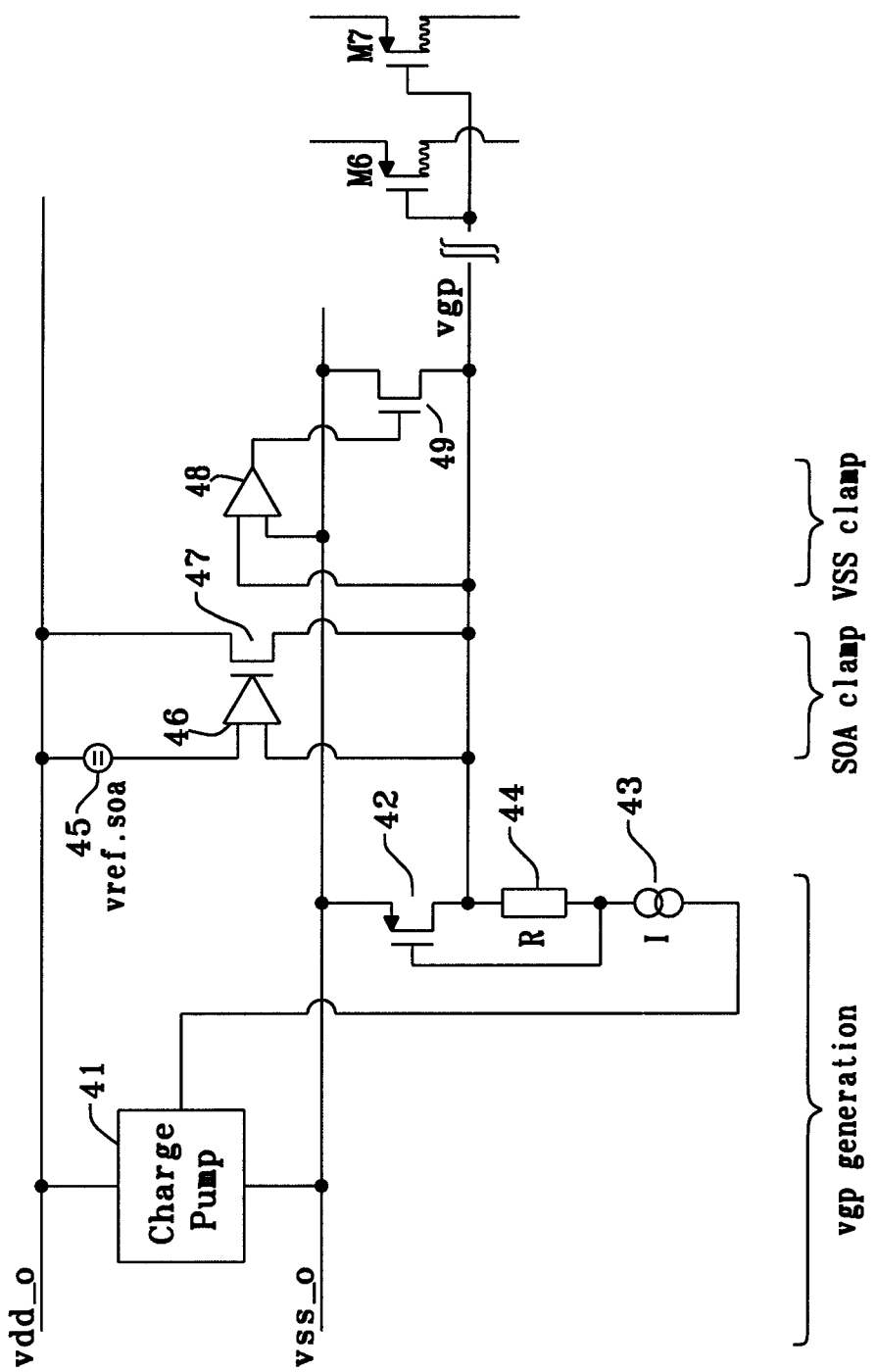
FIG. 4 shows an exemplary implementation of a dynamical adaptation of the control voltage for a level up shifter circuit.

FIG. 4 shows an exemplary implementation of a dynamical adaptation of the control voltage vgp for a level up shifter circuit. As already discussed in the foregoing description, the level shifter circuit may generate the control voltage such that the control voltage is (a) greater than or equal to the first threshold voltage (vss_o−vth_pmos), (b) greater than or equal to the second threshold voltage (vdd_o−vgs_max, wherein vgs_max denotes the maximum allowable gate-source voltage of protection transistors M6/M7 which does not destroy the gate-oxide of the latter transistors), and (c) smaller than or equal to the output reference voltage (vss_o).

In order to generate the control voltage which is greater than or equal to the first threshold voltage, the level shifter circuit may comprise an auxiliary reference potential generator (such as e.g. a charge pump 41) for generating an auxiliary reference potential below the output reference voltage. The level shifter circuit may further comprise a diode-connected transistor 42 and a current source 43 coupled in series between said auxiliary reference potential and the output reference voltage vss_o for generating the control voltage vgp which may be subsequently applied to the control terminals of the first and the second protection transistor M6/M7. The first threshold voltage, which may serve as initial control voltage, may be derived e.g. from the source or the drain of said diode-connected transistor 42. For example, the threshold voltage of the diode-connected transistor may be equal to or similar to the threshold voltage of the first or the second protection transistor. Further, the level shifter circuit may comprise a resistive element 44 coupled in series with the diode-connected transistor 42 and the current source 43 for adjusting the control voltage.

In order to generate the control voltage vgp which is greater than or equal to the second threshold voltage, the level shifter circuit may comprise a second reference potential generator for generating the second threshold voltage. The second reference potential generator may comprise e.g. reference voltage source 45 which is coupled to the output supply voltage vdd_o, wherein said reference voltage source 45 is configured to generate a voltage corresponding to the maximum gate-source voltage of the first or the second protection transistor. The level shifter circuit may further comprise a comparator circuit 46 configured to compare the second threshold voltage generated by the second reference potential generator with the initial control voltage. The level shifter circuit may further comprise a transistor 47 for enforcing the second threshold voltage, wherein said transistor 47 is coupled between the output supply voltage vdd_o and the output reference voltage vss_o, and wherein said transistor 47 is controlled by said comparator 46. The level shifter circuit may further comprise a vss clamp, comprising a comparator circuit 48 configured to compare control voltage vgp with the output reference vss_o, and a transistor 49 coupled between vss_o and vgp.

Figure 5:
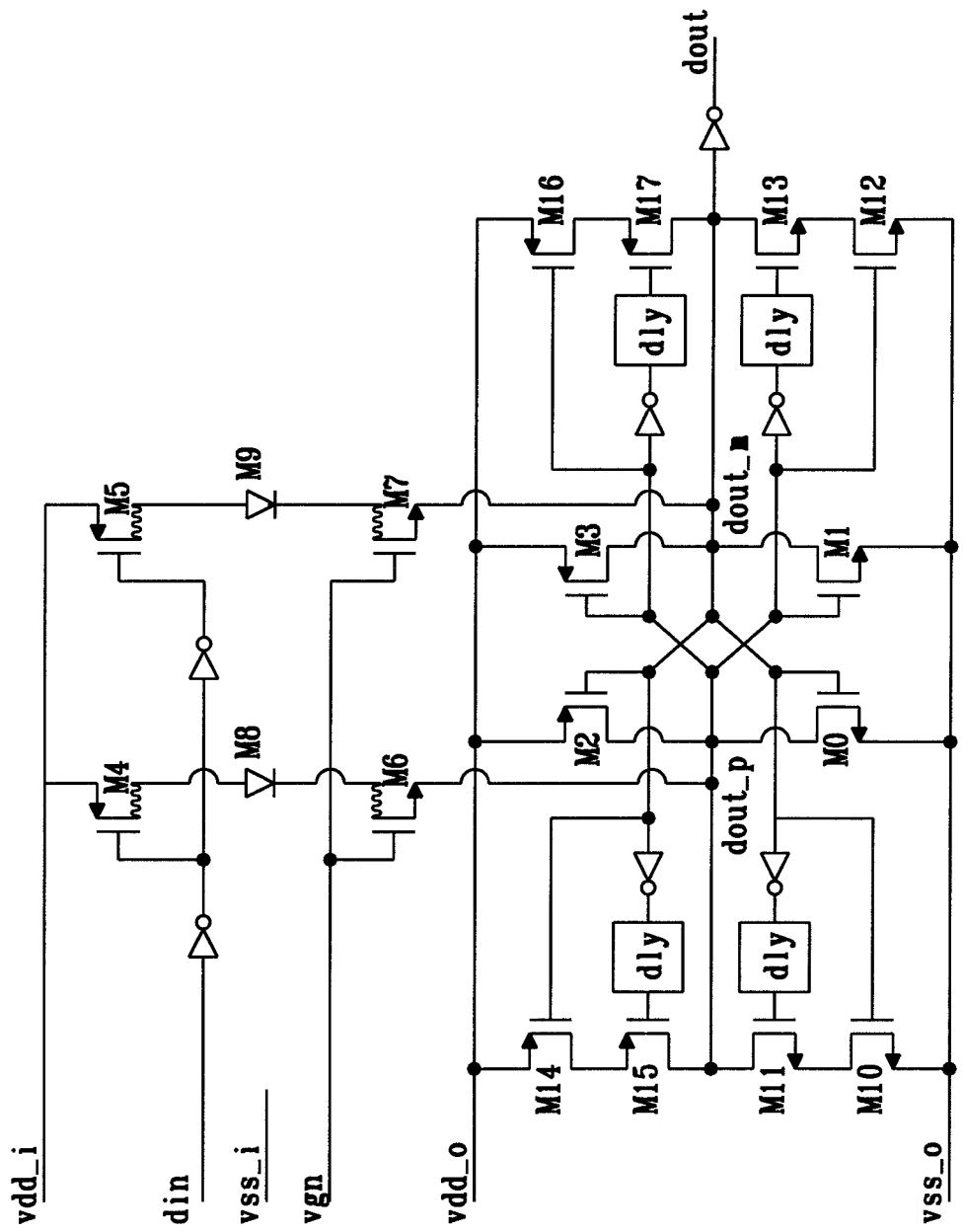
FIG. 5 shows an exemplary embodiment of a level down shifter circuit.
Figure 6:
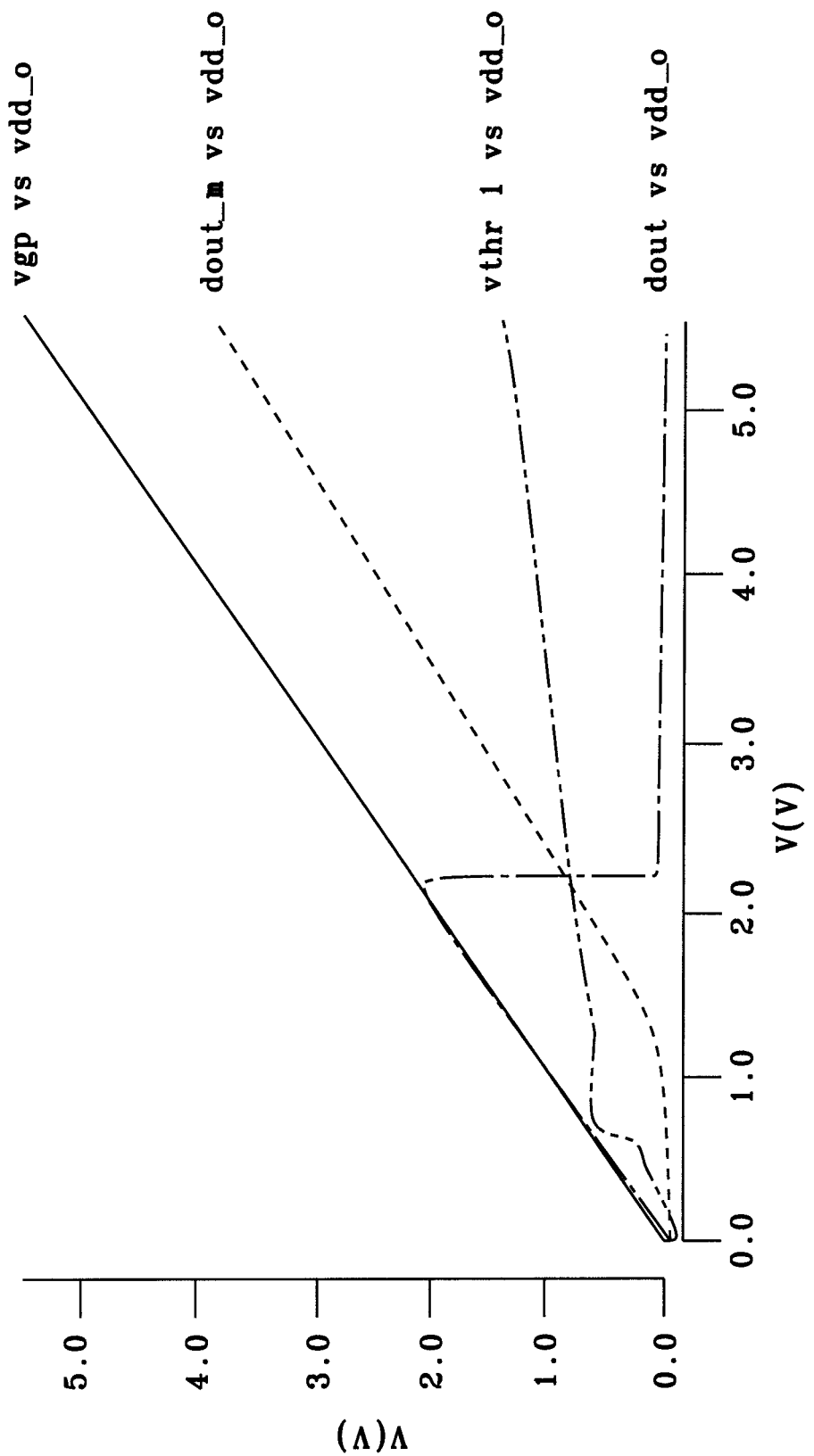
FIG. 6 shows exemplary voltage diagrams for a static control voltage.

FIG. 5 shows an exemplary embodiment of a level down shifter circuit. Transistors M0/M1 and M4/M5 form a basic level shifter. Transistors M0/M1/M2/M3 form a latch. Transistors M4/M5 and M6/M7 are for high voltage HV protection such that the latch in the output supply domain is protected by HV transistor cascodes. Transistors M2/M3 ensure a well-defined high value for dout_p/dout_m ("push-pull" drive). Transistors M10 . . . M17 are for speedup purposes. Transistors M8/M9 avoid reverse current in case of vdd_i<vdd_o. Again, the gates of protection transistors M6/M7 are driven by a control voltage vgn. When the input din changes from 1 to 0 (or 0 to 1), the transistor M5 (or M4) turns on and needs to pull up dout_m (or Bout p) above the threshold of transistors M0/M2 (or M2/M3), i.e. vthr1. FIG. 6 shows that this works only above an output supply level of about 2.2V in the case that the HV NMOS (M6/M7) gate vgn is set to vdd_o. This is a process limitation.

Figure 7:
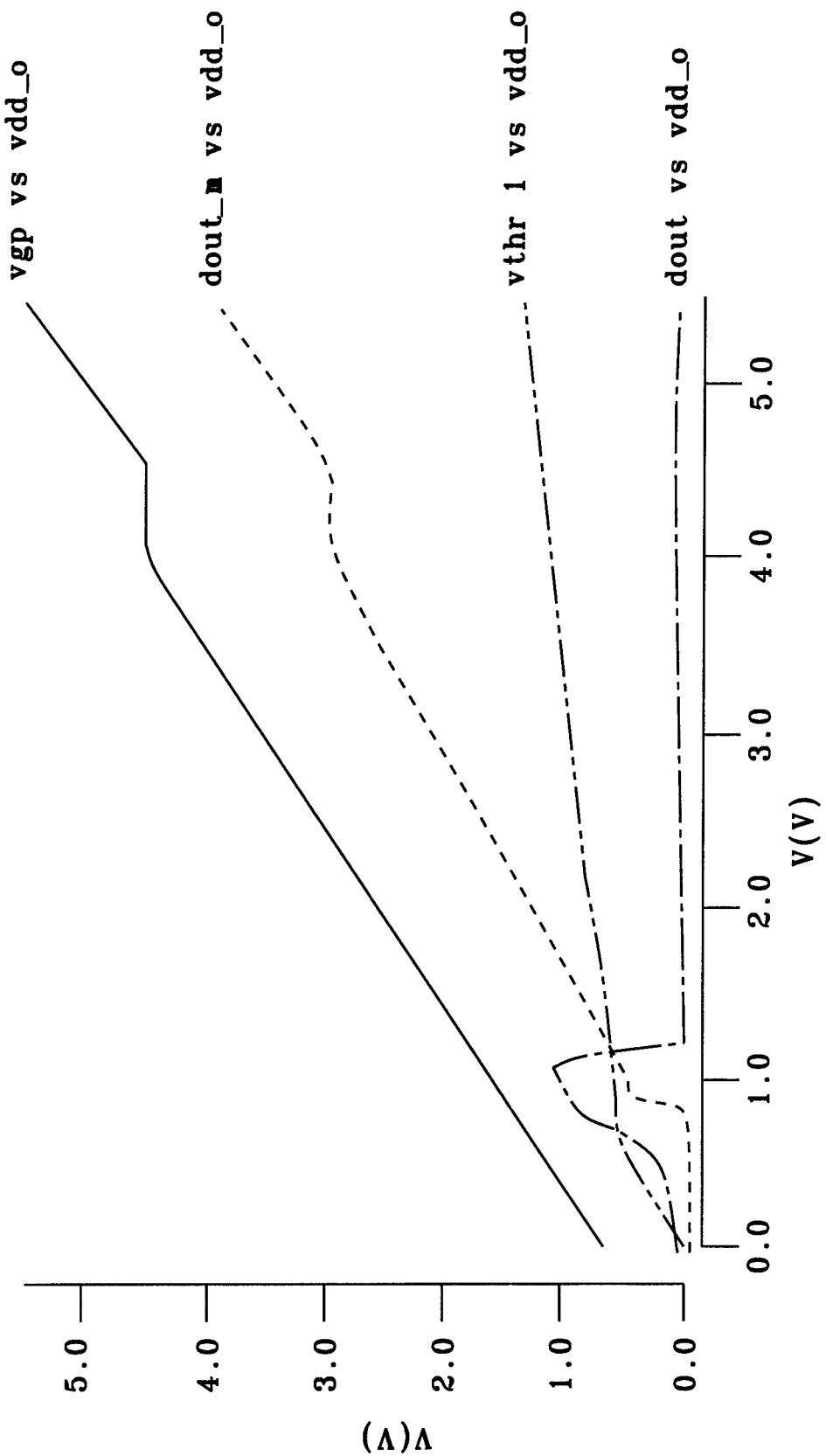
FIG. 7 shows exemplary voltage diagrams for a control voltage which is dynamically adapted.

FIG. 7 shows the improved solution with the auxiliary HV NMOS gate supply vgn (i.e. control voltage) that is adaptively derived from the output supply level. This solution allows the minimum supply level to be far lower than 2V.

The adaptive derivation of vgn must fulfill the following conditions:
the control voltage vgn must be less than or equal to vdd_o+vth_nmos (i.e. one threshold voltage above vdd_o)
the control voltage vgn must be less than or equal to vss_o+vgs_max (i.e. vss_o+vgp must not exceed the SOA limit),
whichever is the smaller one. This ensures enough headroom for the HV NMOS (M6/M7) at low supply voltages and being safe with SOA for the HV NMOS (M6/M7) at high supply voltages (where the headroom is not needed anymore). Note that to simplify the design, vgs_max can be somewhat lower than the SOA limit as long as there is still enough headroom, but in this case it must be ensured that vgn does not go below vdd_o, so additionally the control voltage vgn must fulfill the following condition:
vgn must be greater than or equal to vdd_o
The resulting constraint for the control voltage vgn can be written as:

$$\max(\min((vdd\_o+vth\_nmos),(vss\_o+vgs\_\max)), vdd\_o) \geq vgn \geq vdd\_o$$

Figure 8:
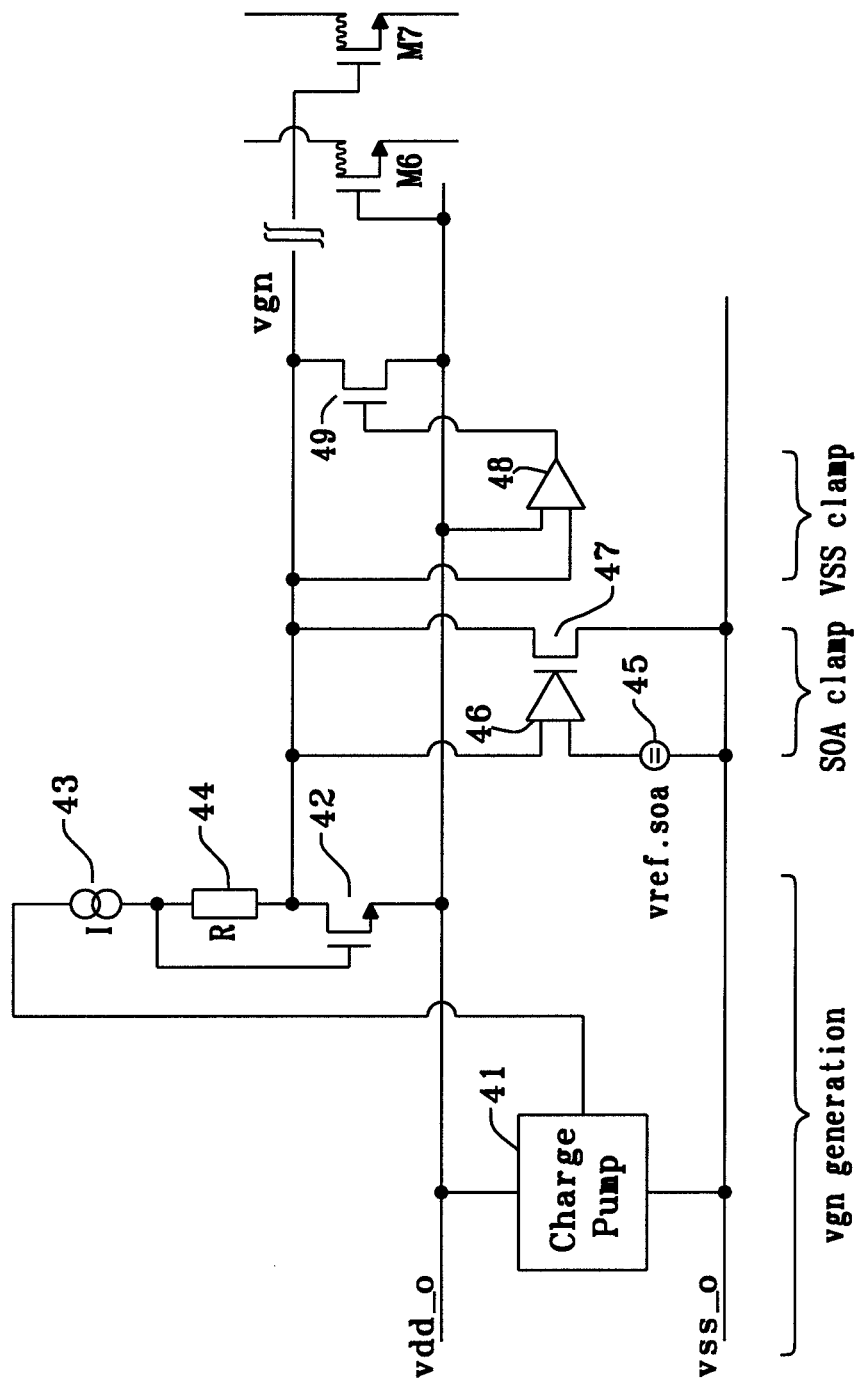
FIG. 8 shows an exemplary implementation of a dynamical adaptation of the control voltage for a level down shifter circuit.

FIG. 8 shows an exemplary implementation of a dynamical adaptation of the control voltage vgn for a level down shifter circuit.

Figure 9:
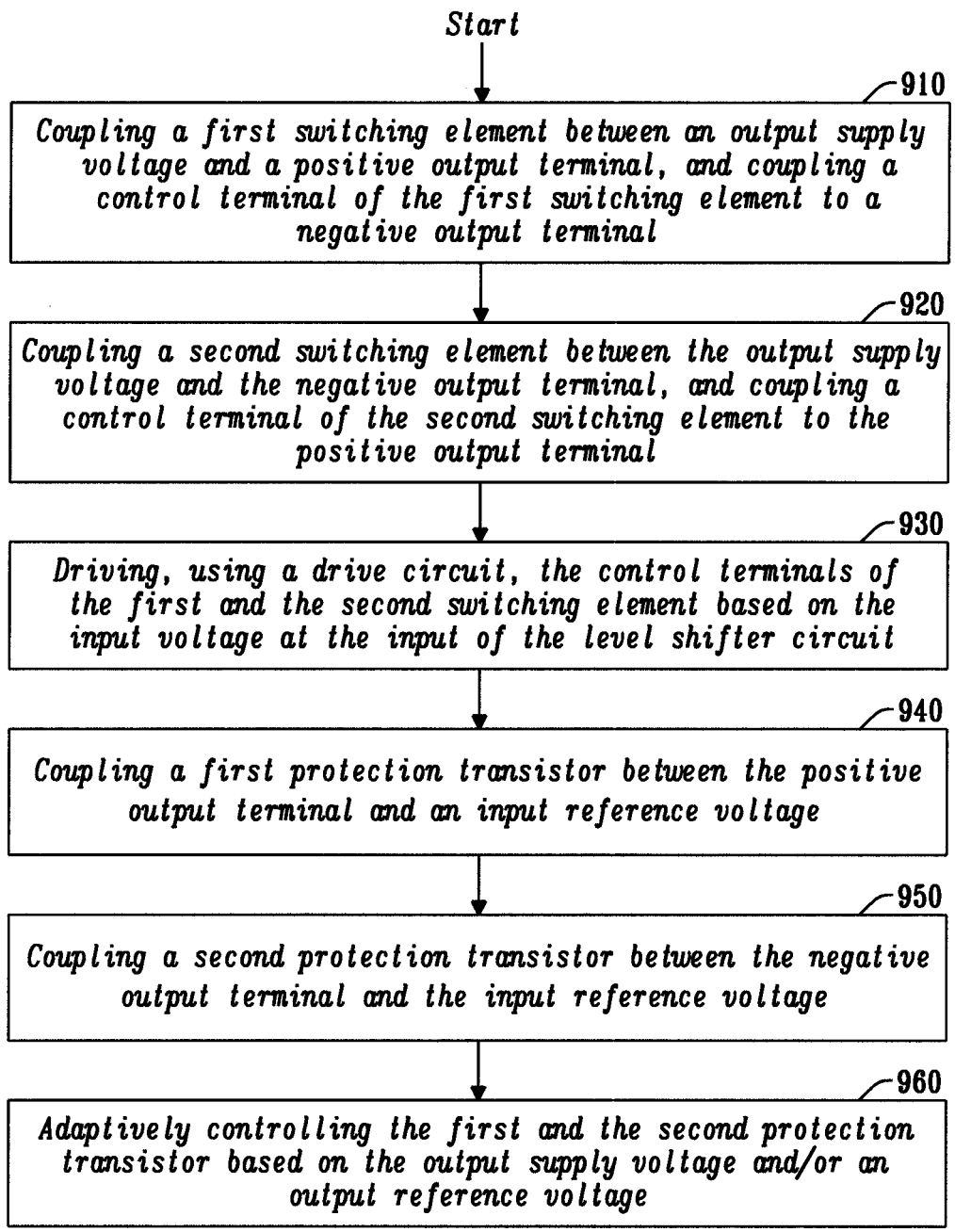
FIG. 9 shows a flow chart for a method of transforming a high voltage level.

FIG. 9 shows a flow chart for a method of transforming a high voltage level. The flow chart comprises step 910, coupling a first switching element between an output supply voltage and a positive output terminal, and coupling a control terminal of the first switching element to a negative output terminal. The method comprises step 920, coupling a second switching element between the output supply voltage and the negative output terminal, and coupling a control terminal of the second switching element to the positive output terminal. The method comprises step 930, driving, using a drive circuit, the control terminals of the first and the second switching element based on the input voltage at the input of the level shifter circuit. The method comprises step 940, coupling a first protection transistor between the positive output terminal and an input reference voltage. The method comprises step 950, coupling a second protection transistor between the negative output terminal and the input reference voltage, and step 960, adaptively controlling the first and the second protection transistor based on the output supply voltage and/or an output reference voltage.

In conclusion, the present document discloses various level shifters designed for the application in a switching converter. They are robust level shifters that can operate in environments where the input supply domain vs. the output supply domain can move against each other with a rate of several 100V/ns. They are level sensitive (i.e. not solely edge sensitive). Although being very robust, the described level shifters consume no static current and only very low current during changing the digital input/output. One of the main characteristics is that these level shifters can operate down to very low supply voltages where the threshold of the protecting HV MOS (i.e. M6/M7) is limiting in other architectures. They are operational even in the corner case where the domains are at the same voltage level, with a protection for the case that the input supply is lower than the output supply.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A level shifter circuit configured to transform an input voltage at an input of the level shifter circuit into an output voltage at an output of the level shifter circuit, the level shifter circuit comprising:
a first switching element coupled between an output supply voltage and a positive output terminal, wherein a control terminal of the first switching element is coupled to a negative output terminal,
a second switching element coupled between the output supply voltage and the negative output terminal, wherein a control terminal of the second switching element is coupled to the positive output terminal,
a drive circuit configured to drive the control terminals of the first and the second switching element based on the input voltage at the input of the level shifter circuit,
a first protection transistor coupled between the positive output terminal and an input reference voltage, and
a second protection transistor coupled between the negative output terminal and the input reference voltage,
wherein the level shifter circuit is configured to adaptively control the first and the second protection transistor based on the output supply voltage and/or an output reference voltage; and
wherein the level shifter circuit further comprises:
a first directional conducting element coupled between the positive output terminal and the input reference voltage, and
a second directional conducting element coupled between the negative output terminal and the input reference voltage.

2. The level shifter circuit according to claim 1, wherein the level shifter circuit is configured to generate a control voltage dependent on the output supply voltage and/or the output reference voltage, and wherein the level shifter circuit is configured to apply the control voltage to control terminals of the first and the second protection transistors.

3. The level shifter circuit according to claim 2, wherein the level shifter circuit is configured to generate the control voltage such that the control voltage is greater than or equal to a first threshold voltage, wherein the first threshold voltage is equal to the output reference voltage minus a threshold voltage of the first or the second protection transistor.

4. The level shifter circuit according to claim 3, wherein the level shifter circuit is configured to generate the control voltage such that the control voltage is greater than or equal to a second threshold voltage, wherein the second threshold voltage is equal to the output supply voltage minus a maximum gate-source voltage of the first or the second protection transistor.

5. The level shifter circuit according to claim 2, wherein the level shifter circuit is configured to generate the control voltage such that the control voltage is smaller than or equal to the output reference voltage.

6. The level shifter circuit according to claim 1, wherein the drive circuit comprises
 a first drive transistor coupled between the positive output terminal and the input reference voltage, wherein a control terminal of the first drive transistor is coupled to the input of the level shifter circuit, and
 a second drive transistor coupled between the negative output terminal and the input reference voltage, wherein a control terminal of the second drive transistor is coupled to the input of the level shifter circuit.

7. A level shifter circuit configured to transform an input voltage at an input of the level shifter circuit into an output voltage at an output of the level shifter circuit, the level shifter circuit comprising:
 a first switching element coupled between an output supply voltage and a positive output terminal, wherein a control terminal of the first switching element is coupled to a negative output terminal,
 a second switching element coupled between the output supply voltage and the negative output terminal, wherein a control terminal of the second switching element is coupled to the positive output terminal,
 a drive circuit configured to drive the control terminals of the first and the second switching element based on the input voltage at the input of the level shifter circuit,
 a first protection transistor coupled between the positive output terminal and an input reference voltage, and
 a second protection transistor coupled between the negative output terminal and the input reference voltage,
wherein the level shifter circuit is configured to adaptively control the first and the second protection transistor based on the output supply voltage and/or an output reference voltage; and
wherein the level shifter circuit further comprises:
 a third switching element coupled between the positive output terminal and the output reference voltage, wherein a control terminal of the third switching element is coupled to the negative output terminal,
 a fourth switching element coupled between the negative output terminal and the output reference voltage, wherein a control terminal of the fourth switching element is coupled to the positive output terminal.

8. A level shifter circuit configured to transform an input voltage at an input of the level shifter circuit into an output voltage at an output of the level shifter circuit, the level shifter circuit comprising:
 a first switching element coupled between an output supply voltage and a positive output terminal, wherein a control terminal of the first switching element is coupled to a negative output terminal,
 a second switching element coupled between the output supply voltage and the negative output terminal, wherein a control terminal of the second switching element is coupled to the positive output terminal,
 a drive circuit configured to drive the control terminals of the first and the second switching element based on the input voltage at the input of the level shifter circuit,
 a first protection transistor coupled between the positive output terminal and an input reference voltage, and
 a second protection transistor coupled between the negative output terminal and the input reference voltage,
wherein the level shifter circuit is configured to adaptively control the first and the second protection transistor based on the output supply voltage and/or an output reference voltage; and
wherein the level shifter circuit further comprises a first auxiliary switching element, a second auxiliary switching element, a first delay element, and a first inverter, wherein
 the first auxiliary switching element and the second auxiliary switching element are coupled in series between the output supply voltage and the positive output terminal,
 the negative output terminal is coupled to a control terminal of the first auxiliary switching element, and
 the negative output terminal is coupled via the first delay element and via the first inverter to a control terminal of the second auxiliary switching element.

9. A level shifter circuit configured to transform an input voltage at an input of the level shifter circuit into an output voltage at an output of the level shifter circuit, the level shifter circuit comprising:
 a first switching element coupled between an output supply voltage and a positive output terminal, wherein a control terminal of the first switching element is coupled to a negative output terminal,
 a second switching element coupled between the output supply voltage and the negative output terminal, wherein a control terminal of the second switching element is coupled to the positive output terminal,
 a drive circuit configured to drive the control terminals of the first and the second switching element based on the input voltage at the input of the level shifter circuit,
 a first protection transistor coupled between the positive output terminal and an input reference voltage, and
 a second protection transistor coupled between the negative output terminal and the input reference voltage,
wherein the level shifter circuit is configured to adaptively control the first and the second protection transistor based on the output supply voltage and/or an output reference voltage; and
wherein the level shifter circuit further comprises a third auxiliary switching element, a fourth auxiliary switching element, a second delay element, and a second inverter, wherein
 the third auxiliary switching element and the fourth auxiliary switching element are coupled in series between the output supply voltage and the negative output terminal,
 the positive output terminal is coupled to a control terminal of the third auxiliary switching element, and
 the positive output terminal is coupled via the second delay element and via the second inverter to a control terminal of the fourth auxiliary switching element.

10. A level shifter circuit configured to transform an input voltage at an input of the level shifter circuit into an output voltage at an output of the level shifter circuit, the level shifter circuit comprising:
 a first switching element coupled between an output reference voltage and a positive output terminal, wherein a control terminal of the first switching element is coupled to a negative output terminal,
 a second switching element coupled between the output reference voltage and the negative output terminal, wherein a control terminal of the second switching element is coupled to the positive output terminal,
 a drive circuit configured to drive the control terminals of the first and the second switching element based on the input voltage at the input of the level shifter circuit, a first protection transistor coupled between the positive output terminal and an input supply voltage, and
a second protection transistor coupled between the negative output terminal and the input supply voltage,
wherein the level shifter circuit is configured to adaptively control the first and the second protection transistor based on an output supply voltage and/or the output reference voltage; and
wherein the level shifter circuit further comprises:
a first directional conducting element coupled between the positive output terminal and the input supply voltage, and
a second directional conducting element coupled between the negative output terminal and the input supply voltage.

11. The level shifter circuit according to claim 10, wherein the level shifter circuit is configured to generate a control voltage dependent on the output supply voltage and/or the output reference voltage, and wherein the level shifter circuit is configured to apply the control voltage to control terminals of the first and the second protection transistors.

12. The level shifter circuit according to claim 11, wherein the level shifter circuit is configured to generate the control voltage such that the control voltage is smaller than or equal to a first threshold voltage, wherein the first threshold voltage is equal to the output supply voltage plus a threshold voltage of the first or the second protection transistor.

13. The level shifter circuit according to claim 12, wherein the level shifter circuit is configured to generate the control voltage such that the control voltage is smaller than or equal to a second threshold voltage, wherein the second threshold voltage is equal to the output reference voltage plus a maximum gate-source voltage of the first or the second protection transistor.

14. The level shifter circuit according to claim 11, wherein the level shifter circuit is configured to generate the control voltage such that the control voltage is larger than or equal to the output supply voltage.

15. The level shifter circuit according to claim 10, wherein the drive circuit comprises
a first drive transistor coupled between the positive output terminal and an input supply voltage, wherein a control terminal of the first drive transistor is coupled to the input of the level shifter circuit, and
a second drive transistor coupled between the negative output terminal and the input supply voltage, wherein a control terminal of the second drive transistor is coupled to the input of the level shifter circuit.

16. A level shifter circuit configured to transform an input voltage at an input of the level shifter circuit into an output voltage at an output of the level shifter circuit, the level shifter circuit comprising:
a first switching element coupled between an output reference voltage and a positive output terminal, wherein a control terminal of the first switching element is coupled to a negative output terminal,
a second switching element coupled between the output reference voltage and the negative output terminal, wherein a control terminal of the second switching element is coupled to the positive output terminal,
a drive circuit configured to drive the control terminals of the first and the second switching element based on the input voltage at the input of the level shifter circuit,
a first protection transistor coupled between the positive output terminal and an input supply voltage, and
a second protection transistor coupled between the negative output terminal and the input supply voltage,
wherein the level shifter circuit is configured to adaptively control the first and the second protection transistor based on an output supply voltage and/or the output reference voltage; and
wherein the level shifter circuit further comprises
a third switching element coupled between the positive output terminal and the output supply voltage, wherein a control terminal of the third switching element is coupled to the negative output terminal,
a fourth switching element coupled between the negative output terminal and the output supply voltage, wherein a control terminal of the fourth switching element is coupled to the positive output terminal.

17. A level shifter circuit configured to transform an input voltage at an input of the level shifter circuit into an output voltage at an output of the level shifter circuit, the level shifter circuit comprising:
a first switching element coupled between an output reference voltage and a positive output terminal, wherein a control terminal of the first switching element is coupled to a negative output terminal,
a second switching element coupled between the output reference voltage and the negative output terminal, wherein a control terminal of the second switching element is coupled to the positive output terminal,
a drive circuit configured to drive the control terminals of the first and the second switching element based on the input voltage at the input of the level shifter circuit,
a first protection transistor coupled between the positive output terminal and an input supply voltage, and
a second protection transistor coupled between the negative output terminal and the input supply voltage,
wherein the level shifter circuit is configured to adaptively control the first and the second protection transistor based on an output supply voltage and/or the output reference voltage; and
wherein the level shifter circuit further comprises a first auxiliary switching element, a second auxiliary switching element, a first delay element, and a first inverter, wherein
the first auxiliary switching element and the second auxiliary switching element are coupled in series between the output reference voltage and the positive output terminal,
the negative output terminal is coupled to a control terminal of the first auxiliary switching element, and
the negative output terminal is coupled via the first delay element and via the first inverter to a control terminal of the second auxiliary switching element.

18. A level shifter circuit configured to transform an input voltage at an input of the level shifter circuit into an output voltage at an output of the level shifter circuit, the level shifter circuit comprising:
a first switching element coupled between an output reference voltage and a positive output terminal, wherein a control terminal of the first switching element is coupled to a negative output terminal,
a second switching element coupled between the output reference voltage and the negative output terminal, wherein a control terminal of the second switching element is coupled to the positive output terminal,
a drive circuit configured to drive the control terminals of the first and the second switching element based on the input voltage at the input of the level shifter circuit,
a first protection transistor coupled between the positive output terminal and an input supply voltage, and
a second protection transistor coupled between the negative output terminal and the input supply voltage, wherein the level shifter circuit is configured to adaptively control the first and the second protection transistor based on an output supply voltage and/or the output reference voltage; and wherein the level shifter circuit further comprises a third auxiliary switching element, a fourth auxiliary switching element, a second delay element, and a second inverter, wherein the third auxiliary switching element and the fourth auxiliary switching element are coupled in series between the output reference voltage and the negative output terminal, the positive output terminal is coupled to a control terminal of the third auxiliary switching element, and the positive output terminal is coupled via the second delay element and via the second inverter to a control terminal of the fourth auxiliary switching element.

19. A method of transforming, using a level shifter circuit, an input voltage at an input of the level shifter circuit into an output voltage at an output of the level shifter circuit, the method comprising:

coupling a first switching element between an output supply voltage and a positive output terminal, and coupling a control terminal of the first switching element to a negative output terminal, coupling a second switching element between the output supply voltage and the negative output terminal, and coupling a control terminal of the second switching element to the positive output terminal, driving, using a drive circuit, the control terminals of the first and the second switching element based on the input voltage at the input of the level shifter circuit, coupling a first protection transistor between the positive output terminal and an input reference voltage, coupling a second protection transistor between the negative output terminal and the input reference voltage, and adaptively controlling the first and the second protection transistor based on the output supply voltage and/or an output reference voltage, wherein the method further comprises:

coupling a first directional conducting element between the positive output terminal and the input reference voltage, and coupling a second directional conducting element between the negative output terminal and the input reference voltage.

20. The method according to claim 19, further comprising generating a control voltage dependent on the output supply voltage and/or the output reference voltage, and applying the control voltage to control terminals of the first and the second protection transistors.

21. The method according to claim 20, further comprising generating the control voltage such that the control voltage is greater than or equal to a first threshold voltage, wherein the first threshold voltage is equal to the output reference voltage minus a threshold voltage of the first or the second protection transistor.

22. The method according to claim 21, further comprising generating the control voltage such that the control voltage is greater than or equal to a second threshold voltage, wherein the second threshold voltage is equal to the output supply voltage minus a maximum gate-source voltage of the first or the second protection transistor.

23. The method according to claim 20, further comprising generating the control voltage such that the control voltage is smaller than or equal to the output reference voltage.

24. The method according to claim 19, further comprising coupling a first drive transistor of the drive circuit between the positive output terminal and the input reference voltage, and coupling a control terminal of the first drive transistor to the input of the level shifter circuit, and coupling a second drive transistor of the drive circuit between the negative output terminal and the input reference voltage, and coupling a control terminal of the second drive transistor to the input of the level shifter circuit.

25. A method of transforming, using a level shifter circuit, an input voltage at an input of the level shifter circuit into an output voltage at an output of the level shifter circuit, the method comprising:

coupling a first switching element between an output reference voltage and a positive output terminal, and coupling a control terminal of the first switching element to a negative output terminal, coupling a second switching element between the output reference voltage and the negative output terminal, and coupling a control terminal of the second switching element to the positive output terminal, driving, using a drive circuit, to drive the control terminals of the first and the second switching element based on the input voltage at the input of the level shifter circuit, coupling a first protection transistor between the positive output terminal and an input supply voltage, coupling a second protection transistor between the negative output terminal and the input supply voltage, and adaptively controlling the first and the second protection transistor based on an output supply voltage and/or the output reference voltage, wherein the method further comprises:

coupling a first directional conducting element between the positive output terminal and the input supply voltage, and coupling a second directional conducting element between the negative output terminal and the input supply voltage.

26. The method according to claim 25, further comprising generating a control voltage dependent on the output supply voltage and/or the output reference voltage, and applying the control voltage to control terminals of the first and the second protection transistors.

27. The method according to claim 26, further comprising generating the control voltage such that the control voltage is smaller than or equal to a first threshold voltage, wherein the first threshold voltage is equal to the output supply voltage plus a threshold voltage of the first or the second protection transistor.

28. The method according to claim 27, further comprising generating the control voltage such that the control voltage is smaller than or equal to a second threshold voltage, wherein the second threshold voltage is equal to the output reference voltage plus a maximum gate-source voltage of the first or the second protection transistor.

29. The method according to claim 26, further comprising generating the control voltage such that the control voltage is larger than or equal to the output supply voltage.

30. The method according to claim 26, further comprising
coupling a first drive transistor between the positive output terminal and an input supply voltage, wherein a control terminal of the first drive transistor is coupled to the input of the level shifter circuit, and
coupling second drive transistor between the negative output terminal and the input supply voltage, wherein a control terminal of the second drive transistor is coupled to the input of the level shifter circuit.

* * * * *